(12) United States Patent
Ishii

(10) Patent No.: US 8,008,739 B2
(45) Date of Patent: Aug. 30, 2011

(54) MICROELECTROMECHANICAL APPARATUS AND METHOD FOR PRODUCING THE SAME

(75) Inventor: Itaru Ishii, Kirishima (JP)

(73) Assignee: Kyocera Corporation, Kyoto (JP)

( * ) Notice: Subject to any disclaimer, the term of this patent is extended or adjusted under 35 U.S.C. 154(b) by 437 days.

(21) Appl. No.: 12/159,356

(22) PCT Filed: Dec. 26, 2006

(86) PCT No.: PCT/JP2006/325979
§ 371 (c)(1),
(2), (4) Date: Jun. 26, 2008

(87) PCT Pub. No.: WO2007/074846
PCT Pub. Date: Jul. 5, 2007

(65) Prior Publication Data
US 2010/0176468 A1      Jul. 15, 2010

(30) Foreign Application Priority Data

Dec. 26, 2005   (JP) ................................. 2005-371519

(51) Int. Cl.
*H01L 29/84* (2006.01)
(52) U.S. Cl. ................. 257/417; 257/415; 257/E29.324; 257/E21.502
(58) Field of Classification Search .................. 257/417, 257/E21.502, E29.324
See application file for complete search history.

(56) References Cited

U.S. PATENT DOCUMENTS

| | | | |
|---|---|---|---|
| 5,668,057 A * | 9/1997 | Eda et al. ....................... | 438/113 |
| 6,407,482 B2 | 6/2002 | Sakata et al. | |
| 6,603,238 B2 | 8/2003 | Sakata et al. | |
| 2002/0008444 A1 | 1/2002 | Sakata et al. | |
| 2002/0117937 A1 | 8/2002 | Sakata et al. | |

FOREIGN PATENT DOCUMENTS

| | | |
|---|---|---|
| JP | 2001-057436 | 2/2001 |
| JP | 2003-179085 | 6/2003 |
| JP | 2005-072419 | 3/2005 |
| JP | 2005-072420 | 3/2005 |
| JP | 2005-251898 | 9/2005 |
| KR | 100329246 B1 | 3/2002 |

OTHER PUBLICATIONS

Korean language office action dated Apr. 12, 2010 and its English language translation for corresponding Korean application 20087018469 lists the references above.

* cited by examiner

*Primary Examiner* — Wael M Fahmy
*Assistant Examiner* — Mamadou Diallo
(74) *Attorney, Agent, or Firm* — DLA Piper LLP (US)

(57) ABSTRACT

A microelectromechanical apparatus (X) includes a microelectromechanical component (10), an insulating substrate (21), a through via (22c) disposed in the insulating substrate (21), a sealing member (30) and a conductive connecting member (40). The microelectromechanical device (10) has a semiconductor substrate (11), a microelectromechanical system (12) and an electrode (13) electrically connected to the microelectromechanical system (12). The sealing member (30) is made of glass, is disposed so as to enclose the microelectromechanical system (12) between the semiconductor substrate (11) and the insulating substrate (21), and hermetically seals the microelectromechanical system (12). The conductive connecting member (40) electrically connects the electrode (13) and an end of the through via (22c), at a position spaced away from the sealing member (30).

11 Claims, 5 Drawing Sheets

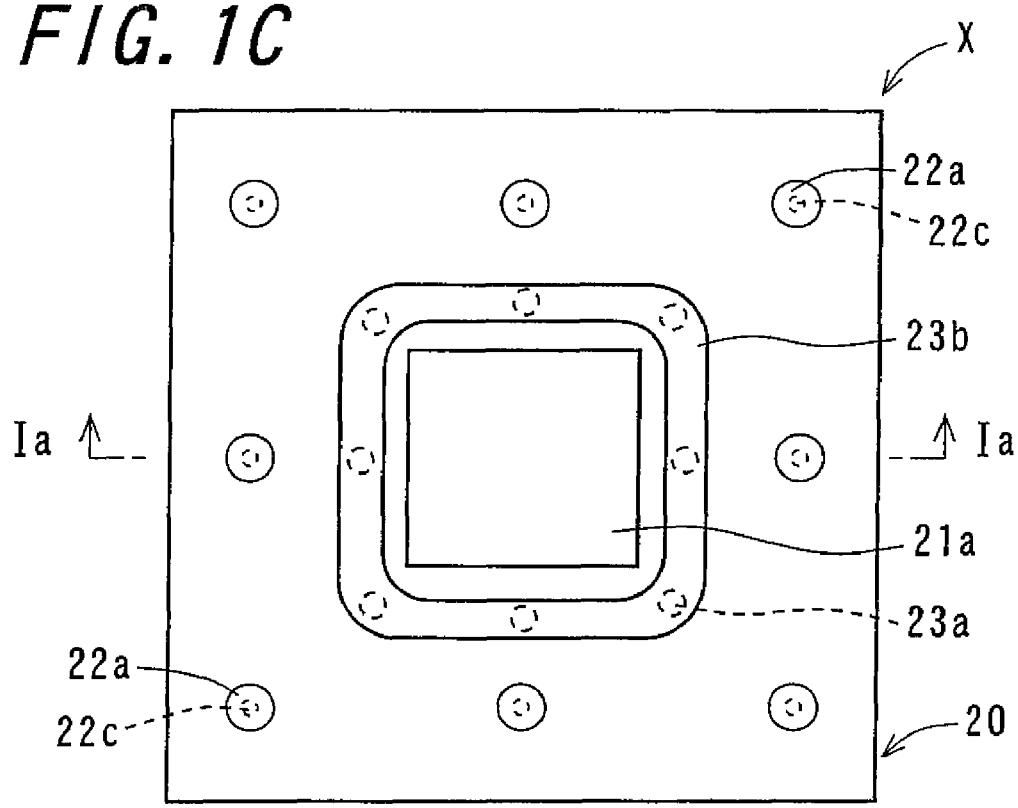

MICROELECTROMECHANICAL APPARATUS AND METHOD FOR PRODUCING THE SAME

CROSS-REFERENCE TO THE RELATED APPLICATIONS

This application is a national stage of international application No. PCT/JP2006/325979 filed Dec. 26, 2006, which also claims benefit of priority under 35 U.S.C. §119 to Japanese Patent Application No. 2005-371519 filed Dec. 26, 2005, the entire contents of which are incorporated herein by reference.

TECHNICAL FIELD

The present invention relates to a microelectromechanical apparatus in which a microelectromechanical system of a microelectromechanical device is hermetically sealed and a method for producing the same.

BACKGROUND ART

Recently, microelectromechanical devices have been attracting attention and developed for practical use, in which a microelectromechanical system (MEMS) is formed on a main surface of a semiconductor substrate made of silicon wafer or other materials by application of processing techniques for forming fine wiring of elements in semiconductor integrated circuits and the like. Various microelectromechanical systems are being developed, and examples thereof include sensors such as accelerometers.

As a technique for sealing this microelectromechanical system, packaging techniques at wafer level have been intensely researched and developed. The packaging techniques are more advantageous than those using wire bonding, in that the package size can be reduced.

For example, Japanese Unexamined Patent Publication JP-A 2005-251898 discloses a microelectromechanical apparatus, comprising a first substrate that includes a microelectromechanical system, and a second substrate that is bonded so as to seal the microelectromechanical system, wherein a solder is used both to connect an electrode disposed on the first substrate and a wiring line disposed on the second substrate and to bond the first substrate and the second substrate.

However, in a case where a solder is used both as a connecting member that connects the electrode and the wiring line and as a sealing member that bonds the first substrate and the second substrate, there is the problem that an electrical short-circuit occurs due to spread of the solder that is melted by heat when the pitch, which is the distance between the connecting member and the sealing member, is small.

DISCLOSURE OF INVENTION

The invention was devised in these circumstances, and it is an object thereof to provide a compact microelectromechanical apparatus in which a short-circuit of a sealing member and a conductive connecting member is prevented, and the microelectromechanical system can be hermetically sealed in an excellent manner, and a method for producing the same.

According to a first aspect of microelectromechanical apparatus, a microelectromechanical apparatus comprises:

a microelectromechanical device comprising a semiconductor substrate, a microelectromechanical system and an electrode electrically connected to the microelectromechanical system formed on one main surface of the semiconductor substrate;

an insulating substrate comprising a first main surface opposed to the one main surface of the semiconductor substrate;

a first conductor inside the insulating substrate, comprising an end which reaches the first main surface and is electrically connected to the electrode;

a sealing member disposed so as to enclose the microelectromechanical system between the one main surface of the semiconductor substrate and the first main surface, the sealing member hermetically sealing the microelectromechanical system and comprising glass; and a conductive connecting member electrically connecting the electrode and the end of the first conductor, at a position spaced away from the sealing member.

According to a second aspect of microelectromechanical apparatus, in the microelectromechanical apparatus of the first aspect, the sealing member may be anodically bonded to the semiconductor substrate.

According to a third aspect of microelectromechanical apparatus, in the microelectromechanical apparatus of the first or second aspect, the conductive connecting member may electrically connect the electrode and the end of the first conductor, outside the sealing member.

According to a fourth aspect of microelectromechanical apparatus, in the microelectromechanical apparatus of any one of the first to third aspects, the insulating substrate may have a first recess portion on the side of the first main surface, and at least a part of the microelectromechanical system is accommodated in the first recess portion.

According to a fifth aspect of microelectromechanical apparatus, in the microelectromechanical apparatus of any one of the first to fourth aspects, the insulating substrate may have a second recess portion on a side of the first main surface, and at least a part of the sealing member is accommodated in the second recess portion.

According to a sixth aspect of microelectromechanical apparatus, in the microelectromechanical apparatus of the fifth aspect, the second recess portion may be in an annular shape.

According to a seventh aspect of microelectromechanical apparatus, in the microelectromechanical apparatus of any one of the first to sixth aspects, the microelectromechanical apparatus may further comprise:

at least one second conductor disposed inside the insulating substrate, comprising an end which reaches the first main surface and is electrically connected to the sealing member; and a conductor pattern disposed between the end of the second conductor and the sealing member.

According to an eighth aspect of microelectromechanical apparatus, in the microelectromechanical apparatus of the seventh aspect, a plurality of second conductors may be arranged, and the microelectromechanical apparatus may further comprise a third conductor that is disposed inside the insulating substrate, and electrically connecting the plurality of second conductors.

According to a ninth aspect of microelectromechanical apparatus, in the microelectromechanical apparatus of the seventh or eighth aspect, it is preferable that the sealing member is overlapped with that of the conductor pattern in plan view.

According to a tenth aspect of microelectromechanical apparatus, the microelectromechanical device of any one of the seventh to ninth aspects may has an electrode layer inside the semiconductor substrate.

According to an eleventh aspect of microelectromechanical apparatus, in the microelectromechanical apparatus of the tenth aspect, the electrode layer reaches a side face of the semiconductor substrate.

According to a twelfth aspect of microelectromechanical apparatus, the microelectromechanical device of tenth or eleventh aspect may further comprise a fourth conductor inside the semiconductor substrate, comprising one end connected to the electrode layer and the other end which reaches a side face or the other main surface opposed to the one main surface of the semiconductor substrate.

According to a first aspect of method for producing a microelectromechanical apparatus, a method for producing a microelectromechanical apparatus of any one of the tenth to twelfth aspects, comprises:

forming the sealing member on the conductor pattern of the insulating substrate;

arranging the one main surface of the semiconductor substrate and the first main surface of the insulating substrate opposed to each other, positioning the electrode layer and the sealing member, and positioning the electrode and the conductive connecting member;

anodically bonding the semiconductor substrate and the sealing member; and connecting the electrode and the end of the first conductor by application of heat to the conductive connecting member.

According, to a second aspect of method for producing a microelectromechanical apparatus, in the method of the first aspect of method for producing a microelectromechanical apparatus, the acts of anodically bonding and connecting may be simultaneously performed.

According to a third aspect of method for producing a microelectromechanical apparatus, in the method of the first or second aspect of method for a microelectromechanical apparatus, the bonding step may comprise:

heating to the sealing member;

pressurizing the sealing member via the semiconductor substrate and the insulating substrate; and applying voltage to the sealing member via the electrode layer in the semiconductor substrate and the second conductor in the insulating substrate.

According to a fourth aspect of method for producing a microelectromechanical apparatus, a method for producing a microelectromechanical apparatus of any one of the tenth to twelfth aspects, comprises:

positioning a semiconductor mother substrate that has a plurality of microelectromechanical device regions each including the microelectromechanical device as a constituent element, and a mother circuit substrate that has a plurality of insulating substrate regions each including the insulating substrate as a constituent element, wherein the sealing member is formed on each insulating substrate;

anodically bonding each semiconductor substrate in the semiconductor mother substrate and each sealing member;

connecting the electrode and the end of the first conductor by application of heat to each conductive connecting member; and cutting the semiconductor mother substrate and the mother circuit substrate that have been bonded using each sealing member.

According to a first aspect of the microelectromechanical apparatus of the invention, the microelectromechanical apparatus comprises a microelectromechanical device comprising a semiconductor substrate, a microelectromechanical system and an electrode electrically connected to the microelectromechanical system formed on one main surface of the semiconductor substrate; an insulating substrate comprising a first main surface opposed to the one main surface of the semiconductor substrate; a first conductor inside the insulating substrate, comprising an end which reaches the first main surface and is electrically connected to the electrode; a sealing member disposed so as to enclose the microelectromechanical system between the one main surface of the semiconductor substrate and the first main surface, the sealing member hermetically sealing the microelectromechanical system and comprising glass; and a conductive connecting member electrically connecting the electrode and the end of the first conductor, at a position spaced away from the sealing member. Accordingly, it is possible to make the pitch between the sealing member and the conductive connecting member small, and it is possible to realize a compact microelectromechanical apparatus.

The method for producing a microelectromechanical apparatus of the invention comprises: forming the sealing member on the conductor pattern of the insulating substrate; arranging the one main surface of the semiconductor substrate and the first main surface of the insulating substrate opposed to each other, positioning the electrode layer and the sealing member, and positioning the electrode and the conductive connecting member; anodically bonding the semiconductor substrate and the sealing member; and connecting the electrode and the end of the first conductor by application of heat to the conductive connecting member. Accordingly, when the one main surface of the semiconductor substrate and the upper face of the insulating substrate are bonded, the sealing member is not melted and spread, and it is possible to produce a compact microelectromechanical apparatus in which the pitch between the sealing member and the conductive connecting member is small.

The first aspect of the method for producing a microelectromechanical apparatus of the invention comprises: a formation step of forming the sealing member on the conductor pattern of the insulating substrate; a positioning step of arranging the one main surface of the semiconductor substrate and the first main surface of the insulating substrate opposed to each other, positioning the electrode layer and the sealing member, and positioning the electrode and the conductive connecting member; a bonding step of anodically bonding the semiconductor substrate and the sealing member; and a connection step of connecting the electrode and the end of the first conductor by application of heat to the conductive connecting member. Accordingly, when the one main surface of the semiconductor substrate and the upper face of the insulating substrate are bonded, the sealing member is not melted and spread, and it is possible to produce a compact microelectromechanical apparatus in which the pitch between the sealing member and the conductive connecting member is small.

The second aspect of the method for producing a microelectromechanical apparatus of the invention comprises: positioning a semiconductor mother substrate that has a plurality of microelectromechanical component microelectromechanical device regions each including the microelectromechanical component microelectromechanical device as a constituent element, and a wiring mother substrate mother circuit substrate that has a plurality of insulating substrate regions each including the insulating substrate as a constituent element, wherein the sealing member is formed on each insulating substrate; a bonding step of anodically bonding each semiconductor substrate in the semiconductor mother substrate and each sealing member; a connection step of connecting the electrode and the end of the first wiring conductor by application of heat to each conductive connecting member; and a step of cutting the semiconductor mother substrate and the wiring mother substrate mother circuit substrate that have been bonded using each sealing member. Accordingly, it is possible to simultaneously obtain a plurality of microelectromechanical apparatuses, and this method is preferable for improving the productivity of the microelectromechanical apparatuses.

BRIEF DESCRIPTION OF DRAWINGS

Other and further objects, features, and advantages of the invention will be more explicit from the following detailed description taken with reference to the drawings.

FIGS. 1A to 1C are views showing a microelectromechanical apparatus according to a first embodiment of the invention.

BEST MODE FOR CARRYING OUT THE INVENTION

Figure 1A:
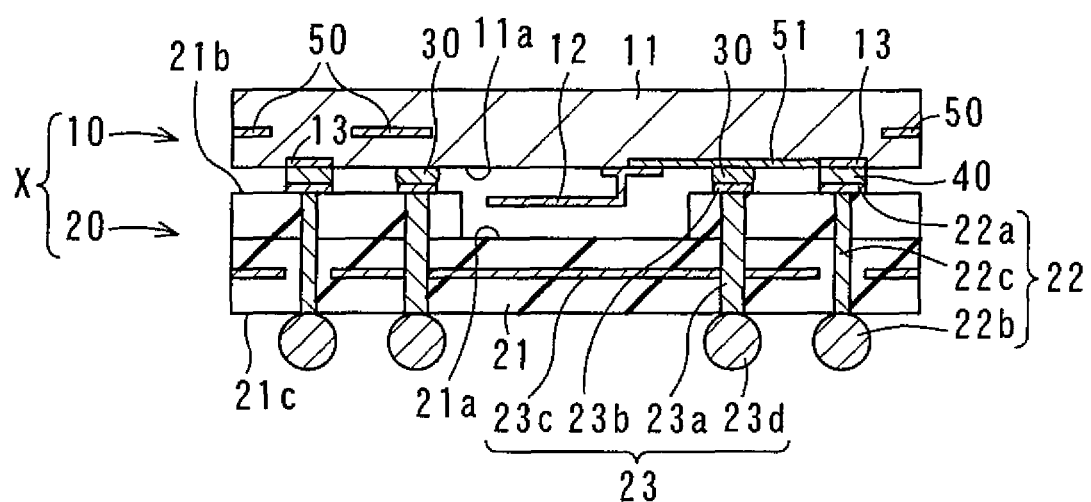

Now referring to the drawings, preferred embodiments of the invention are described below.

Figure 1B:
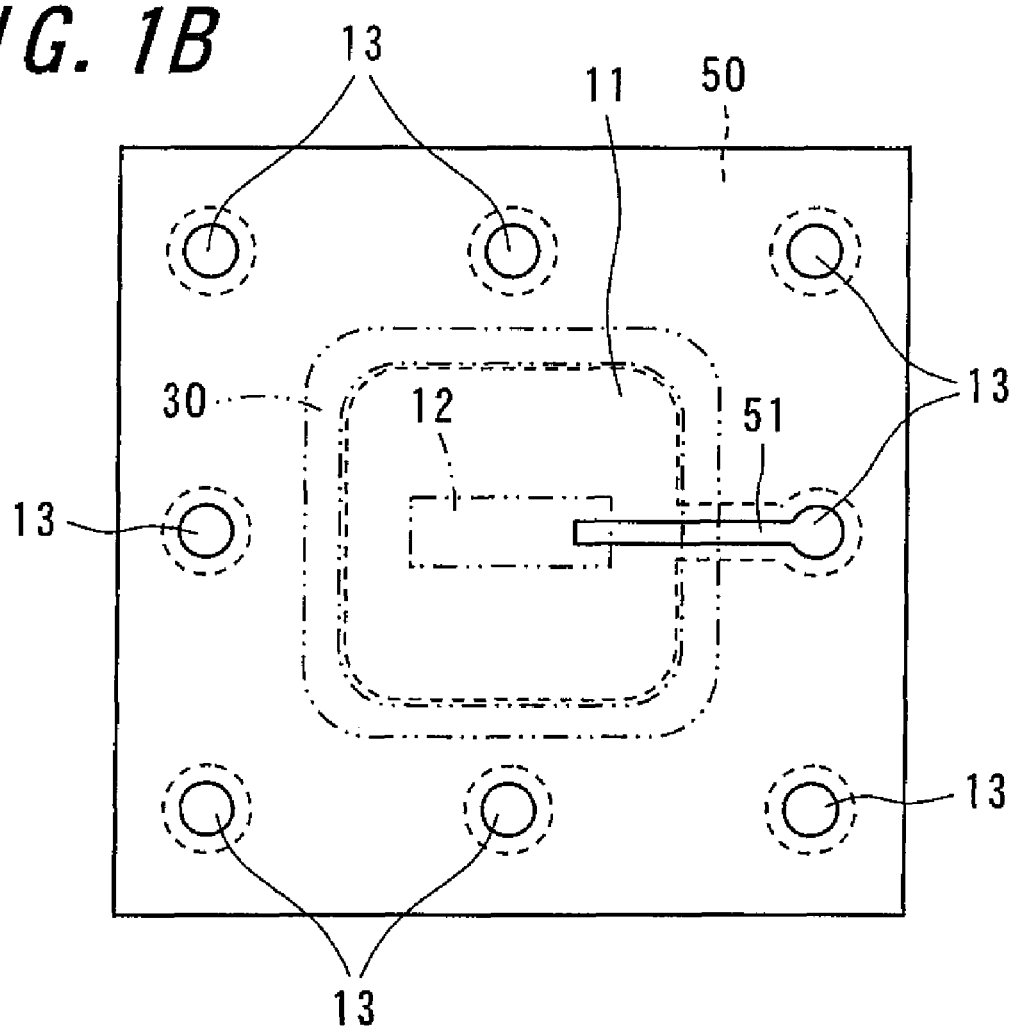

FIGS. 1A to 1C are views showing a microelectromechanical apparatus X according to a first embodiment of the invention. FIG. 1A is a cross-sectional view of the microelectromechanical apparatus X. FIG. 18 is a plan view of a microelectromechanical device 10 that is mounted on a circuit board 20 for the microelectromechanical system. FIG. 1C is a plan view of the circuit board 20 for the microelectromechanical system. Herein, FIG. 1A is a cross-sectional view taken along line Ia-Ia in FIG. 1C. The microelectromechanical apparatus X includes the microelectromechanical device 10, the circuit board 20 for the microelectromechanical system (hereinafter, simply referred to as a 'circuit board'), a sealing member 30, and conductive connecting members 40.

The microelectromechanical device 10 includes a semiconductor substrate 11, a microelectromechanical system 12, and electrodes 13. The semiconductor substrate 11 is, for example, in the shape of a quadrangular plate, and is made of single crystal silicon, multicrystal silicon, amorphous silicon, gallium arsenide, aluminum gallium arsenide, gallium nitride, gallium antimonide, indium arsenide, or the like. The microelectromechanical system 12 is produced by a so-called micromachining method based on semiconductor fine processing techniques, and is formed on one main surface 11a of the semiconductor substrate 11. The microelectromechanical system 12 has the function of, for example, optical switches, display devices, various sensors such as acceleration sensors or pressure sensors, electrical switches, inductors, capacitors, resonators, antennas, microrelays, magnetic heads for hard disks, microphones, biosensors, DNA chips, microreactors, printheads, or the like. The electrodes 13 are sections that function to supply predetermined electric power to the microelectromechanical system 12, or to exchange electrical signals between the microelectromechanical system 12 and an external electric circuit (not shown). The electrodes 13 are formed on the one main surface 11a of the semiconductor substrate 11, and electrically connected to the microelectromechanical system 12 via a conductor 51 that is disposed inside the semiconductor substrate 11 or on the one main surface 11a. Furthermore, an electrode layer 5Q is disposed inside the semiconductor substrate 11, in a region other than the region overlapped with the electrodes 13, preferably, in a region other than the inner region enclosed by the sealing member 30 described later and the regions respectively overlapped with the electrodes 13 and the conductor 51, in plan view of the semiconductor substrate 11. More specifically, as shown in FIGS. 1A and 1B, the electrode layer 50 is disposed on the entire region excluding the inner region enclosed by the sealing member 30, the electrodes 13, and the conductor 51, in plan view of the semiconductor substrate 11. It should be noted that the electrode layer 50 is extended to a side face of the semiconductor substrate 11, and a potential is applied from the outside via this extended portion to the electrode layer 50.

The circuit board 20 includes an insulating substrate 21, a first conductor group 22, and a second conductor group 23. The circuit board 20 is a member that functions to seal the microelectromechanical system 12 of the microelectromechanical device 10 and to electrically connect the microelectromechanical device 10 and an external electric circuit board (not shown).

A first recess portion 21a for accommodating at least a part of the microelectromechanical system 12 of the microelectromechanical device 10 is formed on the insulating substrate 21. Examples of the material constituting the insulating substrate 21 include ceramics such as an aluminum oxide-based sintered compact (alumina ceramics), an aluminum nitride-based sintered compact (aluminum nitride ceramics), a silicon carbide-based sintered compact (silicon carbide ceramics), a silicon nitride-based sintered compact (silicon nitride ceramics), a glass ceramic sintered compact (glass ceramics), and a mullite-based sintered compact, heat curable or ultraviolet curable resins such as an epoxy resin, a polyimide resin, an acrylic resin, a phenolic resin, and a polyester resin, and the like. Among these materials, a mullite-based sintered compact and a glass ceramic sintered compact (e.g., an aluminum oxide-borosilicate glass-based glass ceramic sintered compact) are preferable in view of the reliability of bonding between the insulating substrate 21 and the semiconductor substrate 11 and thus the hermetic sealing properties, because the difference between the coefficient of thermal expansion of each of these materials and that of the material (e.g., silicon) constituting the semiconductor substrate 11 is relatively small. Furthermore, a glass ceramic sintered compact obtained by sintering glass in which borosilicate glass-based substances are contained in aluminum oxide fillers allows the first conductor group 22 and the second conductor group 23 to be made of a material whose electrical, resistance is relatively small (e.g., copper or silver), and has low relative permittivity thereby being capable of preventing electrical signal delay. Thus, such a glass ceramic sintered compact is preferable in view of the use for radio frequency signals.

The first conductor group 22 includes connection pads 22a, connection terminals 22b, and a plurality of through vias 22c, which are first conductors. The first conductor group 22 is a member for establishing electrical conduction between the microelectromechanical device 10 and an external electric circuit board (not shown). The connection pads 22a are formed on an upper face 21b, which is a first math surface of the insulating substrate 21, and electrically connected via the conductive connecting members 40 made of a solder or other materials to the electrodes 13 of the microelectromechanical device 10. The connection pads 22a are formed having a wider area than the other sections in the first conductor group 22. With this configuration, a wider region for establishing electrical connection to the conductive connecting members 40 can be secured, and thus electrical connection can be performed more reliably and more easily. The connection terminals 22b are formed on a lower face 21c of the insulating substrate 21, and electrically connected via conductive connecting members made of a solder or other materials to electrodes of an external electric circuit board (not shown). The connection terminals 22b are formed having a wider area than the other sections in the first conductor group 22. With this configuration, a wider region for establishing electrical connection to the conductive connecting members 40 can be secured, and thus electrical connection can be performed more reliably and more easily. The plurality of through vias 22c are formed so as to extend from the upper face 21b to the lower face 21c of the insulating substrate 21, and each have one end portion electrically connected to the connection pad 22a and the other end portion electrically connected to the connection terminal 22b. Examples of the material constituting the first conductor group 22 include metal materials such as tungsten, molybdenum, manganese, copper, silver, palladium, platinum, gold, or the like.

The second conductor group 23 includes a plurality of through vias 23a, which are second conductors, a conductor pattern 23b, and a conductor layer 23c. The second conductor group 23 is a member that functions to apply voltage to the sealing member 30. The plurality of through vias 23a are formed so as to extend from the upper face 21b to the lower face 21c of the insulating substrate 21. One end portion of each of the through vias 23a is electrically connected to the conductor pattern 23b, a portion between this end portion and the other end portion is electrically connected to the conductor layer 23c, and the other end portion is electrically connected to a solder ball 23d. Herein, such solder balls 23d function as connection terminals for establishing electrical connection to an external electric circuit board. The conductor pattern 23b is formed so as to be exposed on the upper face 21b of the insulating substrate 21, and is a section for directly applying voltage to the sealing member 30 to which voltage is to be applied. In plan view of the microelectromechanical apparatus X, the conductor pattern 23b is positioned inside (closer to the microelectromechanical system than) the connection pads 22a of the first conductor group 22. The conductor layer 23c is electrically connected to the plurality of through vias 23a, and extends inside the insulating substrate 21 in a direction intersecting the plurality of through vias 23a. Herein, the conductor layer 23c is a section that functions to reduce the potential difference between the through vias 23a. The second conductor group 23 may be used in the form of a metallized layer, a plated layer, an evaporated layer, a metal foil layer, or the like. Examples of the material constituting the second conductor group 23 include metal materials such as tungsten, molybdenum, manganese, copper, silver, palladium, platinum, gold, or the like.

Here, an exemplary method for producing the circuit board 20 will be described in which an alumina-based sintered compact is used as the material constituting the insulating substrate 21 and copper is used as the material constituting the first conductor group 22 and the second conductor group 23. First, raw material powders such as an aluminum oxide (alumina) and silica together with additives such an organic solvent and a binder are shaped into sheets, thereby producing a plurality of ceramic green sheets. Next, a part of the produced ceramic green sheets is punched into rectangular plates having a predetermined size that allows at least a part of the microelectromechanical system 12 of the microelectromechanical device 10 to be accommodated. Also, a part of the produced ceramic green sheets is punched into a shape having a predetermined size that allows the through vies 22c and 23a to be formed. Next, a metal paste produced by kneading a copper powder and a glass powder together with additives such as an organic solvent and a binder is printed on the surface or, the punched portions for forming the through vias of the ceramic green sheets constituting the insulating substrate 21, using a predetermined printing method (e.g., screen printing method). When the printing has been performed, a layered body is formed in which the punched ceramic green sheets are layered to have a predetermined size that allows the microelectromechanical system 12 to be accommodated and appropriate through vias 22c and 23a to be formed, and the unpunched ceramic green sheets are layered to have a predetermined size. Next, the layered body on which the metal paste is printed is fired at predetermined firing temperature (e.g., 1300 to 1600° C.). In this manner, the circuit board 20 is produced. It should be noted that the method for producing the circuit board 20 is not limited to the above-described method, and a method also can be applied in which after a fired body without the punched portions for forming the through vias is produced, the punched portions for forming the through vias are formed by predetermined processing means (e.g., a mechanical cutting process or a cutting process using laser light). The method for producing the circuit board 20 is not limited to the above-described simultaneous firing method, and a method also can be applied in which a frame-shaped insulating material made of materials such as a brazing filler metal, glass, or a resin is bonded to the outer peripheral portion on the upper face of a plate-shaped insulating material.

The sealing member 30 is a member that forms a sealing space in which the microelectromechanical system 12 is to be sealed in cooperation with the microelectromechanical device 10 and the circuit board 20, an has one end portion connected to the semiconductor substrate 11 and the other end portion connected to the conductor pattern 23b. The sealing member 30 is overlapped with the conductor pattern 23b in plan view. Accordingly, voltage can be uniformly applied via the conductor pattern 23b to the sealing member 30. Examples of the material constituting the sealing member 30 include materials that function as bonding members by application of voltage, more specifically, silica-based glass or silica-boron-based glass, in which highly ion conductive alkali metal, rare earth, or a halogenated compound is added to glass, for example. Herein, glass refers to a noncrystal insulating material structure that internally contains a metal oxide such as silica or a bismuth (Bi) oxide.

The conductive connecting members 40 are members for establishing electrical conduction between the electrodes 13 of the microelectromechanical device 10 and the connection pads 22a of the circuit board 20, and each has one end portion electrically connected to the electrode 13 of the microelectromechanical device 10 and the other end portion connected to the connection pad 22a of the circuit board 20. The conductive connecting members 40, used when performing flip chip bonding between the semiconductor substrate 11 and the insulating substrate 21 as in the microelectromechanical device 10 according to this embodiment, are generally made of a solder or a brazing filler metal that is melted by heat for use. More specifically, examples of the material constituting the conductive connecting members 40 include tin-lead-based, tin-silver-based, tin-silver-copper-based, and other non-eutectic solder materials, gold-tin brazing filler and other low-melting brazing filler metals, silver-germanium-based or other high-melting brazing filler metals, conductive organic resins, or the like.

In the microelectromechanical apparatus X according to this embodiment, glass is used as the sealing member 30, and the one main surface 11a of the semiconductor substrate 11 and the upper face 21b of the insulating substrate 21 are bonded via the sealing member 30 by application of voltage to the sealing member 30. Thus, in contrast to the case in which materials such as a solder or a brazing filler metal are used as the sealing member 30, melting and spreading of the sealing member 30 are suppressed when the one main surface 11a of the semiconductor substrate 11 and the upper face 21b of the insulating substrate 21 are bonded. Furthermore, even in a case where a separate frame-shaped member is used as the sealing member 30, a solder or a brazing filler metal generally is used as a bonding member when the semiconductor substrate and the frame-shaped member are bonded, and thus the bonding member may be melted and spread at the time of bonding. However, in the microelectromechanical apparatus X according to this embodiment, the sealing member 30 is bonded to the semiconductor substrate 11 by application of voltage to the sealing member 30, and thin melting and spreading of the bonding material are suppressed. Thus, an electrical short-circuit can be prevented from occurring between the conductive connecting members 40 and the sealing member 30 due to melting and spreading of the sealing member 30 or the bonding member. Accordingly, in the microelectromechanical apparatus X according to this embodiment, the pitch between the sealing member 30 and the conductive connecting members 40 can be made small, and thus a compact microelectromechanical apparatus can be realized.

Furthermore, in a case where the semiconductor substrate 11 is made of silicon and glass is used as the sealing member 30, for example, the glass may be Pyrex (registered trademark) glass that contains alkali metal, rare earth, or a halogenated compound, and has a coefficient of thermal expansion close to that of the semiconductor substrate 11. Thus, the semiconductor substrate 11 and the circuit board 20 can be bonded without strain or warp.

Furthermore, the microelectromechanical apparatus X according to this embodiment includes the microelectromechanical device 10 that has the microelectromechanical system 12 formed on the one main surface 11a of the semiconductor substrate 11, the circuit board 20 that has the second conductor group 23 functioning to apply voltage to the sealing member 30, and the sealing member 30 that forms a sealing space in which the microelectromechanical system 12 is to be sealed in cooperation with the microelectromechanical device 10 and the circuit board, 20, and that functions as a bonding member by application of voltage. Thus, in the microelectromechanical apparatus X, voltage can be applied from the second conductor group 23 of the circuit board 20 to the sealing member 30 that functions as a bonding member by application of voltage. Accordingly, sealing can be performed by anodic bonding using a material that contains substantially no organic constituent (e.g., a sealing material for anodic bonding) as the sealing member 30. In this manner, for example, when sealing is performed by anodic bonding using a sealing material for anodic bonding, a residue can be substantially prevented from being formed due to volatization of organic constituents or the like. Thus, in particular in a case where the conductive connecting members 40 are arranged outside the sealing member 30, deterioration of the characteristics of the microelectromechanical system 12 can be suppressed compared with the case in which sealing is performed by bonding using a sealing member in which volatization of organic constituents contained in materials such as resins or solders may occur.

Furthermore, in the microelectromechanical apparatus X according to this embodiment, the electrode layer 50 is disposed inside the semiconductor substrate 11, in a region other than the region opposed to the electrodes 13, preferably, in a region other than the inner region enclosed by the sealing member 30 and the regions respectively opposed to the electrodes 13 and the conductor 51. Thus; in plan view, the electrode layer 50 covers substantially the entire region of the semiconductor substrate 11. Accordingly, anodic bonding using the sealing member 30 can be performed more easily.

The circuit board 20 in the microelectromechanical apparatus X uses not a lead wire, but the second conductor group 23 that includes the plurality of through vias 23a and the conductor pattern 23b, in order to apply voltage to the sealing member 30. Thus, this configuration is preferable for downsizing the microelectromechanical apparatus X. In a case where a lead wire is used, variation of the bonded state (bonding strength) tends to increase depending on the positional relationship between the sealing member 30 and the lead wire (e.g., the distance from the lead wire), and thus when a temperature cycling test or the like is performed, cracks and the like from which leakage occurs are easily formed in a section where the bonding strength is relatively low. However, in the microelectromechanical apparatus X, downsizing is realized compared with the case in which a lead wire is used as described above. Accordingly, variation of the bonding strength can be suppressed according to the degree of downsizing realized, and thus formation of cracks and the like from which leakage occurs can be suppressed. Thus, in the microelectromechanical apparatus X, the hermetic sealing properties of the sealing space in which the microelectromechanical system 12 is positioned can be sufficiently secured.

The second conductor group 23 of the circuit board 20 in the microelectromechanical apparatus X further comprises the conductor layer 23c, which is a third conductor that is electrically connected to the plurality of through vias 23a, and extends inside the insulating substrate 21 in a direction intersecting the plurality of through vias 23a. Accordingly, in the microelectromechanical apparatus X, the potential difference between the through vias 23.a can be reduced, and thus variation of the potential in the conductor pattern 23b can be reduced. More specifically, in the microelectromechanical apparatus X, voltage can be applied more uniformly via the conductor pattern 23b to the sealing member 30. Accordingly, variation of the strength in bonding using the sealing member 30 can be suppressed, and thus formation of cracks and the like from which leakage occurs can be suppressed. Thus, in the microelectromechanical apparatus X, the hermetic sealing properties of the sealing space in which the microelectromechanical system 12 is positioned can be sufficiently secured.

Moreover, the microelectromechanical apparatus X has the conductor layer 23c that extends inside the insulating substrate 21 in a direction intersecting the plurality of through vias 23a. Thus, after the microelectromechanical system 2 is sealed by application of voltage to the sealing member 30, the influence of electrical noises acting from the outside on the region (sealing space) in which the microelectromechanical system 12 is accommodated above the conductor layer 23c is decreased, by grounding the second conductor group 23. Accordingly, in the microelectromechanical apparatus X, the electrical shielding function in the region (sealing space) in which the microelectromechanical system 12 is accommodated can be improved.

The plurality of through vias 23a of the circuit board 20 in the microelectromechanical apparatus X are arranged such that the substantially uniform equipotential line is formed in the conductor pattern 23b by the plurality of through vias 23a. With this configuration, the potential difference between the through vias 23a can be substantially eliminated, and thus variation of the potential in the conductor pattern 23b can be further reduced. More specifically, in the microelectromechanical apparatus X, voltage can be applied more uniformly via the conductor pattern 23b to the sealing member 30. Accordingly, variation of the strength in bonding using the sealing member 30 can be suppressed, and thus formation of cracks and the like from which leakage occurs can be suppressed. Thus, in the microelectromechanical apparatus X, the hermetic sealing properties of the sealing space in which the microelectromechanical system 12 is positioned can be sufficiently secured.

In plan view of the microelectromechanical apparatus X, the connection pads 22a are positioned outside the conductor pattern 23b. More specifically, the ends of the first conductor group 22 are electrically connected to the electrodes 13, outside the section at which the one main surface 11a of the semiconductor substrate 11 and the first main surface 21b are bonded using the sealing member 30. With this configuration, even in a case where the connection pads 22a and the electrodes 13 of the microelectromechanical device 10 are electrically bonded using a sealing member in which volatization of organic constituents contained in materials such as solders may occur, the organic constituents formed from the solders can be prevented from being dispersed (scattered) to the region inside the conductor pattern 23b (inside the sealing space in which the microelectromechanical system 12 is positioned) in plan view. Thus, in the microelectromechanical apparatus X, deterioration of the characteristics of the microelectromechanical system 12 can be suppressed.

Furthermore, in a case where the conductive connecting members 40 are arranged outside the sealing member 30, the electrically bonded state between the connection pads 22a and the electrodes 13 of the microelectromechanical device 10 can be checked by a visual inspection. As a result, it is not necessary to check the electrically bonded state by a bonding inspection using X-rays or the like, and thus the work efficiency of the bonding inspection can be improved.

Furthermore, in a case where the conductive connecting members 40 are arranged outside the sealing member 30, the conductive connecting members 40 can be prevented from moving into (entering) the sealing space in which the microelectromechanical system 12 is positioned. Accordingly, in the microelectromechanical apparatus X, problems can be prevented from being caused by the action of the conductive connecting members 40 on the microelectromechanical system 12, and thus the reliability can be improved.

In the description above, glass was used as the sealing member 30, and the sealing member 30 and the semiconductor substrate 11 were anodically bonded by application of voltage to the sealing member 30. However, the semiconductor substrate 11 and the insulating substrate 21 may be bonded also by frit bonding in which the sealing member 30 made of glass is melted by heat and then cured again. In this case, the sealing member 30 is melted and spread, but since the sealing member 30 is an insulating material, an electrical short-circuit can be prevented from occurring between the conductive connecting members 40 and the sealing member 30. Accordingly, the pitch between the sealing member 30 and the conductive connecting members 40 can be made small, and thus a compact microelectromechanical apparatus can be realized. Furthermore, in a case where the semiconductor substrate 11 and the insulating substrate 21 are bonded by frit bonding, the electrode layer 50 and the second conductor group 23 used for applying voltage to the sealing member 30 are not necessary. Thus, the microelectromechanical apparatus X can be produced more easily. It should be noted that in a case where mechanical bonding (sealing) using the sealing member 30 and electrical connection using the conductive connecting members 40 are simultaneously performed, low softening point glass is preferably used as the sealing member 30 that is subjected to frit bonding, and a high melting point metal is preferably used as the conductive connecting members 40. More specifically, low softening pointy glass such as bismuth glass, phosphate glass, vanadium glass, borosilicate glass, or the like is preferably used as the sealing member 30, and a SnPb-based high melting point solder, AnSn, Au, or the like is preferably used as the conductive connecting members 40. It should be noted that in a case where simultaneous bonding is not performed, generally, after connection using the conductive connecting members 40 is performed, frit bonding using the sealing member 30 is performed.

Furthermore, in the microelectromechanical apparatus X, the insulating substrate 21 has the first recess portion on the side of the first main surface 21b, and at least a part of the microelectromechanical system 12 is accommodated in the first recess portion 21a. Accordingly, the one main surface 11a of the semiconductor substrate 11 and the first main surface 21b of the insulating substrate 21 can be arranged closer to each other, and thus the microelectromechanical device 10 and the circuit board 20 can be arranged closer to each other. Thus, it is possible to lower the height of the apparatus and to downsize the apparatus.

Hereinafter, a method for producing the microelectromechanical apparatus X will be described. In FIGS. 2A to 2D, the electrode layer 50 is not shown for facilitating understanding of the drawings.

Figure 2A:
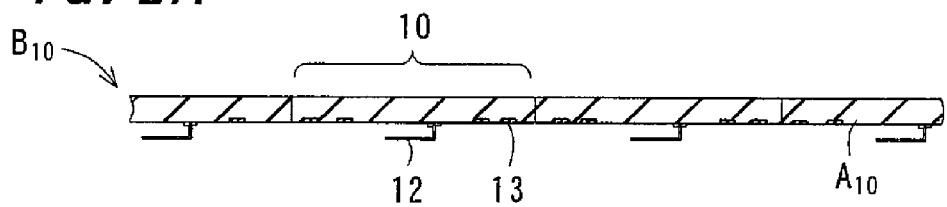
FIG. 2 is a cross-sectional view showing a series of steps of a method for producing the microelectromechanical apparatus shown in FIGS. 1A to 1C.

First, as shown in FIG. 2A, a semiconductor mother substrate $B_{10}$ that has microelectromechanical device regions $A_{10}$ including a plurality of microelectromechanical devices 10 as constituent elements is prepared. The microelectromechanical system 12 and the electrodes 13 are formed in each of the constituent elements.

Figure 2B:
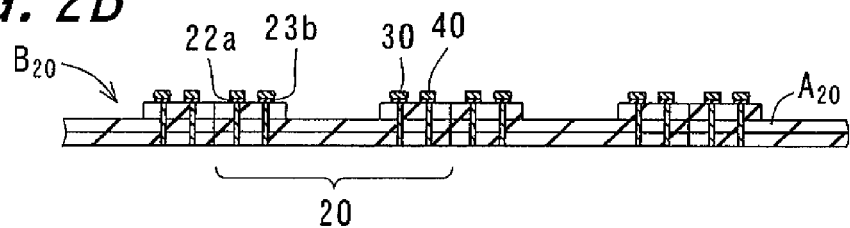

Next, as shown in FIG. 2B, a mother circuit substrate $B_{20}$ that has insulating substrate regions $A_{20}$ including a plurality of circuit boards 20 containing insulating substrates 21 as constituent elements is prepared. The connection pads 22a and the conductor pattern 23b are formed in each of the constituent elements. Furthermore, the conductive connecting members 40 are formed on the connection pads 22a, and the sealing member 30 is formed on the conductor pattern 23b. In a case where tin-silver-based or other solders are used as the conductive connecting members 40; the conductive connecting members 40 are formed on the connection pads 22a, by positioning solder balls on the connection pads 22a, and melting the solder balls by heat to be bonded to the connection pads 22a. The sealing member 30 is formed on the conductor pattern 23b, by forming a glass layer by a sputtering method or the like, positioning, on the conductor pattern 23b, a glass mask formed so as to have the same shape as that of the conductor pattern 23b, and performing exposure and etching processes thereon. In a case where the sealing member 30 and the conductive connecting members 40 are formed in advance at predetermined positions in this manner, mechanical bonding (sealing) using the sealing member 30 and electrical connection using the conductive connecting members 40 can be simultaneously performed, and thus the work efficiency in producing the microelectromechanical apparatus X can be improved.

Figure 2C:
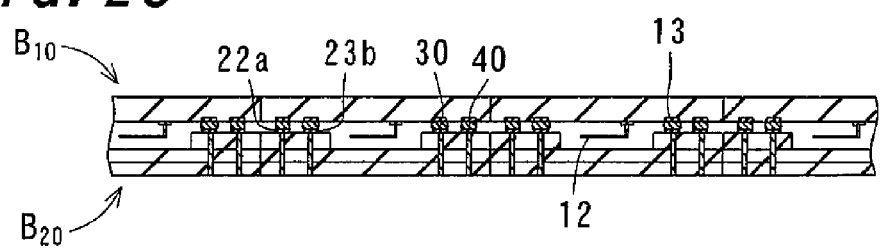

Next, as shown in FIG. 2C, a bonded body is formed by bonding the semiconductor mother substrate $B_{10}$ and the mother circuit substrate $B_{20}$ via the sealing member 30. More specifically, the bonded body is formed by positioning the semiconductor mother substrate $B_{10}$ and the mother circuit substrate $B_{20}$, that is, by positioning each electrode layer 50 and each sealing member 30, and each electrode 13 and each conductive connecting member 40, bonding each electrode 13 of the semiconductor mother substrate $B_{10}$ and each connection pad 22a of the mother circuit substrate $B_{20}$ via the conductive connecting member 40, and bonding the semiconductor mother substrate $B_{10}$ and each conductor pattern 23b of the mother circuit substrate $B_{20}$ via the sealing member 30. In a case where a tin-silver-based solder is used as the conductive connecting members 40, and the conductive connecting members 40 and the sealing member 30 have substantially the same height, each electrode 13 of the semiconductor mother substrate $B_{10}$ and each connection pad 22a of the mother circuit substrate $B_{20}$ are bonded by placing each electrode 13 of the semiconductor mother substrate $B_{10}$ on the conductive connecting member 40 formed on each connection pad 22a of the mother circuit substrate $B_{20}$ and performing thermocompression bonding at predetermined temperature (e.g., 250 to 300° C.) and predetermined pressure (e.g. 0.1 MPa). Moreover, in a case where Pyrex (registered trademark) glass is used as the sealing member 30, and the sealing member 30 and the conductive connecting members 40 have substantially the same height, the semiconductor mother substrate $B_{10}$ and each conductor pattern 23b of the mother circuit substrate $B_{20}$ are bonded by placing the semiconductor mother substrate $B_{10}$ on the sealing member 30 formed on each conductor pattern 23b of the mother circuit substrate $B_{20}$, applying heat at predetermined temperature (e.g., 200 to 400° C.), and then applying predetermined voltage (e.g., 50 to 300V) while applying pressure (e.g., 0.01 MPa).

Herein, examples of the method for applying predetermined voltage while applying pressure include a method in which a conductive plate (made of a carbon resin or the like) for establishing electrical conduction is disposed on the entire lower face of the mother circuit substrate $B_{20}$, and voltage is applied between the electrode layer 50 of the semiconductor mother substrate $B_{10}$ and the conductive plate while pressure is applied using the conductive plate. With this method, pressure can be applied more uniformly using the conductive plate via the mother circuit substrate $B_{20}$ to the entire sealing member 30, and voltage can be applied more uniformly using the conductive plate via the plurality of through vies 23a and the conductor pattern 23b to the entire sealing member 30. Thus, with this method, variation of the bonding strength throughout the entire sealing member 30 can be suppressed, and thus formation of cracks and the like from which leakage occurs can be suppressed. Accordingly, the hermetic sealing properties of the sealing space in which the microelectromechanical system 12 is positioned can be sufficiently secured.

Furthermore, in a case where a solder is used as the conductive connecting members 40, as this solder, a material is preferably selected whose bonding temperature is higher than that of the sealing member 30. When this sort of material is selected, electrical connection using the conductive connecting members 40 can be performed in a state where the temperature is increased to predetermined temperature, after sealing is performed using the sealing member 30. Thus, organic constituents or the like contained in the solder used as the conductive connecting members 40 can be effectively prevented from being attached to the microelectromechanical system 12.

Figure 2D:
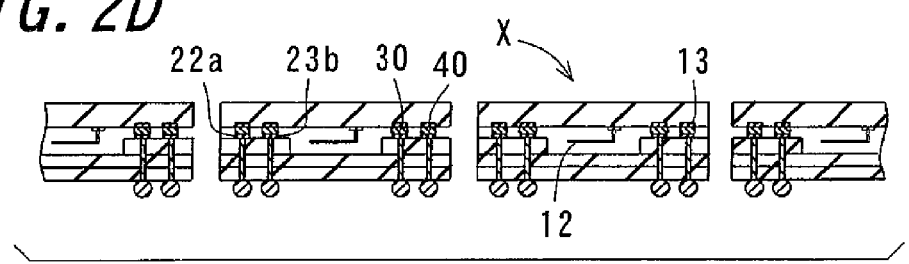

Next, as shown in FIG. 2D, the bonded body of the semiconductor mother substrate $B_{10}$ and the mother circuit substrate $B_{20}$ is divided in the unit of the constituent elements that are formed into the microelectromechanical apparatus X, using known dividing means (e.g., a dicing process). In this manner, the microelectromechanical apparatus X can be obtained.

With the method for producing the microelectromechanical apparatus X according to this embodiment, a plurality of microelectromechanical apparatuses X can be obtained all at once. Thus, this method is preferable for improving the productivity of the microelectromechanical apparatuses X. Furthermore, in a case where the connection pads 22a and the electrodes 13 of the microelectromechanical device 10 are electrically bonded using the conductive connecting members 40, heat and pressure that are to be applied to the sealing member 30 can be used in the bonding. Thus, this electrical bonding and the sealing using the sealing member 30 can be simultaneously performed. Thus, this production method is preferable for improving the productivity of the microelectromechanical apparatuses X.

Figure 3:
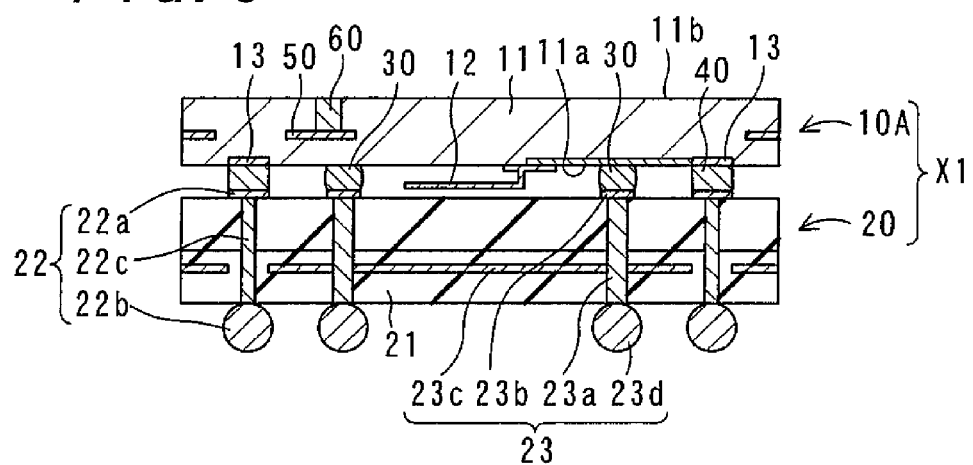
FIG. 3 is a cross-sectional view showing a microelectromechanical apparatus according to a second embodiment of the invention.

FIG. 3 is a cross-sectional view showing a microelectromechanical apparatus X1 according to a second embodiment of the invention. In this embodiment, the portions corresponding to those in the configuration of the foregoing embodiment are denoted by the same reference numerals, and a description thereof has been omitted. The microelectromechanical apparatus X1 includes a microelectromechanical device 10A, the circuit board 20, the sealing member 30, and the conductive connecting members 40. The microelectromechanical device 10A includes a fifth conductor 60 that is disposed inside the semiconductor substrate 11, and has one end extended to the electrode layer 50 disposed inside the semiconductor substrate 11 and the other end extended to a side face or the other main surface 11b opposed to the one main surface 11a of the semiconductor substrate 11 (in this embodiment, the other main surface 11b). With this configuration, voltage can be applied from the microelectromechanical device 10A via the fifth conductor 60 to the sealing member 30, and thus the microelectromechanical device 10A and the circuit board 20 can be anodically bonded using the sealing member 30.

Figure 4:
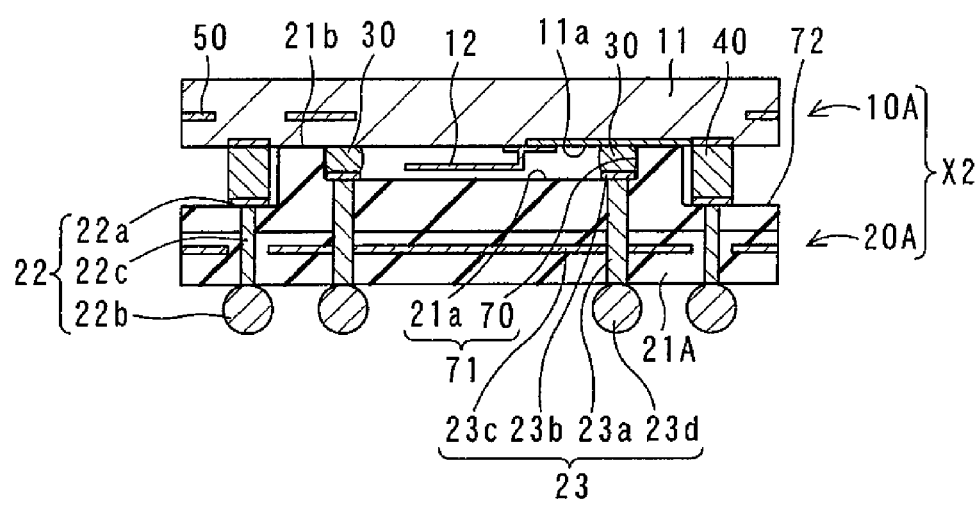
FIG. 4 is a cross-sectional view showing a microelectromechanical apparatus according to a third embodiment of the invention.

FIG. 4 is a cross-sectional view showing a microelectromechanical apparatus X2 according to a third embodiment of the invention. In this embodiment, the portions corresponding to those in the configuration of the foregoing embodiments are denoted by the same reference numerals, and a description thereof has been omitted. The microelectromechanical apparatus X2 includes the microelectromechanical device 10A, a circuit board 20A, the sealing member 30, and the conductive connecting members 40. An insulating substrate 21A constituting the circuit board 20A has not only the first recess portion 21a, but also a second recess portion 70 and a third recess portion 72 on the side of the first main surface 21b. The second recess portion 70 is disposed so as to enclose, in an annular shape, the outer side of the first recess portion 21a. At least a part (all, in this embodiment) of the sealing member 30 is accommodated in the second recess portion 70. In this embodiment shown in FIG. 4, the first recess portion 21a and the second recess portion 70 are continuously formed, and thus one recess portion 71 is constituted by the first recess portion 21a and the second recess portion 70. More specifically, in the recess portion 71, the annular sealing member 30 is accommodated adjacent to the inner peripheral face of the insulating substrate 21A that defines the recess portion 71. The third recess portion 72 is disposed outside the recess portion 71. At least a part (all, in this embodiment) of the conductive connecting members 40 is accommodated in the third recess portion 72. In this manner, at least a part of the sealing member 30 is accommodated in the second recess portion 70, that is, in the recess portion 71, and thus the one main surface 11e of the semiconductor substrate 11 and the first main surface 21b of the insulating substrate 21A can be arranged closer to each other, and thus the microelectromechanical device 10A and the circuit board 20A can be arranged closer to each other. Thus, it is possible to lower the height of the apparatus and to downsize the apparatus.

It should be noted that even in a case where not the second recess portion 70 but only the third recess portion 72 is provided in the insulating substrate 21A, the amount of the conductive connecting members 40 can be adjusted with the depth of the third recess portion 72. Thus, the connecting strength between the electrodes 13 of the microelectromechanical device 10 and the connection pads 22a of the circuit board 20 can be improved by using more conductive connecting members 40.

In the description above, specific embodiments of the invention were shown, but the invention is not limited to these, and various changes can be made without departing from the idea of the invention.

In the foregoing embodiments, one microelectromechanical system 12 is formed in each microelectromechanical apparatus X, but a plurality of microelectromechanical systems 12 may be formed in one microelectromechanical apparatus.

In the foregoing embodiments, the first recess portion 21a is formed in the insulating substrate 21 of the circuit board 20, but this first recess portion 21a is not absolutely necessary. For example, the drive region (sealing space) of the microelectromechanical system 12 may be secured by adjusting the height of the sealing member 30 as appropriate.

Furthermore, in the foregoing embodiments, in plan view of microelectromechanical apparatus X, the shape of the sealing member 30 is overlapped with that of the conductor pattern 23b, but this is not absolutely necessary. For example, it is sufficient that the sealing member 30 and the conductor pattern 23b are at least partially overlapped. Here, note that a larger overlap area realizes more efficient application of voltage via the conductor pattern 23b to the sealing member 30.

In the foregoing embodiments, the external terminals that establish electrical connection between the circuit board 20 and an external electric circuit board (not shown) are not limited to the solder balls 23d. For example, a lead terminal or a conductive adhesive also may be used.

In the foregoing embodiments, in order to improve the electromagnetic shielding effect for the microelectromechanical system 12, a conductive layer to which a ground potential is supplied may be also formed inside the insulating substrate 21 of the circuit board 20.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A microelectromechanical apparatus comprising:
    a semiconductor substrate;
    a circuit substrate opposed to the semiconductor substrate;
    a microelectromechanical system between the semiconductor substrate and the circuit substrate, arranged on the semiconductor substrate;
    a sealing member between the semiconductor substrate and the circuit substrate, enclosing the microelectromechanical system in plan view, the sealing member comprising a glass; and
    a conductive connecting member between the semiconductor substrate and the circuit substrate, through which the microelectromechanical system is electrically connected to the circuit substrate; the conductive connecting member being apart from the sealing member, wherein the conductive connecting member is outside of a region enclosed by the sealing member.

2. The microelectromechanical apparatus of claim 1, wherein the sealing member is anodically bonded to the semiconductor substrate.

3. The microelectromechanical apparatus of claim 1, wherein the circuit substrate has a first recess portion on a first surface opposed to the semiconductor substrate, and
    at least a part of the microelectromechanical system is in the first recess portion.

4. The microelectromechanical apparatus of claim 1, wherein the circuit substrate has a second recess portion on a first surface opposed to the semiconductor substrate, and
    at least a part of the sealing member is in the second recess portion.

5. The microelectromechanical apparatus of claim 4, wherein the second recess portion is in an annular shape.

6. The microelectromechanical apparatus of claim 1, further comprising:
    a conductor pattern between the sealing member and the circuit substrate, electrically connected to the circuit substrate.

7. The microelectromechanical apparatus of claim 6, wherein the circuit substrate has a plurality of first conductors electrically connected to each other and electrically connected to the conductor pattern.

8. The microelectromechanical apparatus of claim 6, wherein the sealing member is overlapped with the conductor pattern in plan view.

9. The microelectromechanical apparatus of claim 6, further comprising an electrode layer inside the semiconductor substrate.

10. The microelectromechanical apparatus of claim 9, wherein a part of the electrode layer is on a surface of the semiconductor substrate.

11. The microelectromechanical apparatus of claim 9, further comprising:
    a second conductor comprising one end connected to the electrode layer and the other end on a surface of the semiconductor substrate, the surface being not opposed to the circuit substrate.

* * * * *